(12) United States Patent
Aoki et al.

(10) Patent No.: US 8,868,414 B2
(45) Date of Patent: Oct. 21, 2014

(54) AUDIO SIGNAL PROCESSING DEVICE WITH ENHANCEMENT OF LOW-PITCH REGISTER OF AUDIO SIGNAL

(75) Inventors: Ryotaro Aoki, Hamamatsu (JP); Hideyuki Tokuhisa, Iwata (JP)

(73) Assignee: Yamaha Corporation (JP)

( * ) Notice: Subject to any disclaimer, the term of this patent is extended or adjusted under 35 U.S.C. 154(b) by 270 days.

(21) Appl. No.: 13/352,920

(22) Filed: Jan. 18, 2012

(65) Prior Publication Data

US 2012/0191462 A1 Jul. 26, 2012

(30) Foreign Application Priority Data

Jan. 20, 2011 (JP) ................................. 2011-010222

(51) Int. Cl.

| | |
|---|---|
| *H03G 7/06* | (2006.01) |
| *H03G 9/18* | (2006.01) |
| *G10L 21/02* | (2013.01) |
| *H03G 9/00* | (2006.01) |
| *H03G 7/00* | (2006.01) |
| *H03G 9/02* | (2006.01) |
| *G10H 1/12* | (2006.01) |
| *G10L 21/038* | (2013.01) |

(52) U.S. Cl.
CPC ............... *H03G 7/007* (2013.01); *H03G 9/005* (2013.01); *H03G 9/025* (2013.01); *G10H 1/125* (2013.01); *H03G 7/002* (2013.01); *H03G 9/18* (2013.01); *G10L 21/038* (2013.01)
USPC ............................. 704/225; 704/205; 381/106

(58) Field of Classification Search
CPC ......... H03G 7/002; H03G 7/007; H03G 7/06; H03G 9/005; H03G 9/025; H03G 9/18; G10L 21/02; G10L 21/0316; G10L 21/034
USPC ............ 704/205, 224, 225; 381/99, 102, 106, 381/107
See application file for complete search history.

(56) References Cited

U.S. PATENT DOCUMENTS 6,111,960 A * 8/2000 Aarts et al. ...................... 381/61
6,606,388 B1 * 8/2003 Townsend et al. .............. 381/17
(Continued)

FOREIGN PATENT DOCUMENTS

| JP | 10117115 A | 5/1998 |
|---|---|---|
| JP | 2005-191851 A | 7/2005 |

(Continued)

OTHER PUBLICATIONS

Japanese Office Action cited in Japanese counterpart application No. JP2011-010222, dated May 7, 2014. English, translation provided.

*Primary Examiner* — Martin Lerner
(74) *Attorney, Agent, or Firm* — Rossi, Kimms & McDowell LLP (57) ABSTRACT

An audio signal processing device is designed to enhance the low-pitch register of an audio signal by generating harmonics causing a missing fundamental effect with a light load of processing but without damaging an audio waveform. The audio signal processing device includes a filtering part (e.g. a band-pass filter configured of a high-pass filter and a low-pass filter) that extracts a low-pitch signal from an audio signal input thereto; a dynamic range compression part that compresses a dynamic range of the low-pitch signal by use of a time-variant gain relative to a peak of the low-pitch signal, which is detected via a peak hold operation using a predetermined time constant, thus producing a compressed signal; and an adder that adds the compressed signal to the audio signal so as to produce a processed audio signal including harmonics.

3 Claims, 10 Drawing Sheets

(56) References Cited

U.S. PATENT DOCUMENTS

| | | | |
|---|---|---|---|
| 7,676,043 B1* | 3/2010 | Tsutsui et al. | 381/17 |
| 7,970,153 B2 | 6/2011 | Konagai et al. | |
| 8,036,394 B1* | 10/2011 | Yonemoto et al. | 381/61 |
| 8,045,731 B2 | 10/2011 | Aoki et al. | |
| 8,090,120 B2* | 1/2012 | Seefeldt | 381/104 |
| 8,638,954 B2* | 1/2014 | Aoki | 381/102 |
| 2004/0114769 A1* | 6/2004 | Little | 381/71.11 |
| 2004/0158458 A1* | 8/2004 | Sluijter et al. | 704/201 |
| 2005/0058303 A1* | 3/2005 | Martin et al. | 381/98 |
| 2005/0245221 A1* | 11/2005 | Beyer | 455/222 |
| 2006/0005694 A1* | 1/2006 | Waller et al. | 84/736 |
| 2007/0168185 A1* | 7/2007 | Takada | 704/205 |
| 2008/0175409 A1* | 7/2008 | Lee et al. | 381/98 |
| 2008/0189102 A1* | 8/2008 | Takada | 704/225 |
| 2009/0016547 A1* | 1/2009 | Aoki et al. | 381/107 |
| 2010/0246853 A1* | 9/2010 | Aoki | 381/99 |
| 2011/0116641 A1* | 5/2011 | Bergere | 381/17 |

FOREIGN PATENT DOCUMENTS

| | | |
|---|---|---|
| JP | 2006-340328 A | 12/2006 |
| JP | 2010-237294 A | 10/2010 |

* cited by examiner

| INPUT (dB) | GAIN (dB) | OUTPUT (dB) |
|---|---|---|
| -60 | 15 | -45 |
| -50 | 15 | -35 |
| -40 | 15 | -25 |
| -30 | 15 | -15 |
| -20 | 10 | -10 |
| -10 | 5 | -5 |
| 0 | 0 | 0 |

AUDIO SIGNAL PROCESSING DEVICE WITH ENHANCEMENT OF LOW-PITCH REGISTER OF AUDIO SIGNAL

BACKGROUND OF THE INVENTION

1. Field of the Invention

The present invention relates to an audio signal processing device with the enhancement of a low-pitch register of an audio signal by way of a missing fundamental effect.

The present application claims priority on Japanese Patent Application No. 2011-10222 filed Jan. 20, 2011, the entire content of which is incorporated herein by reference.

2. Description of the Related Art

Conventionally, audio equipment manufacturers have been struggling to meet commercial needs that customers prefer to reproduce low-pitch registers of audio signals with small-size speakers, however, which cannot adequately reproduce low-pitch registers of audio signals or low-pitch registers of audio frequency. This customers' preference is common in a field of small-size audio devices and multichannel audio systems.

A multichannel audio system may be equipped with a sub-woofer (i.e. a speaker specifically used for reproduction of low-pitch sound) independently of speakers used for sound reproduction of other channels. The boundary of a low-pitch register (i.e. a crossover frequency), which is allocated to a sub-woofer among audio signals of other channels, is determined based on the performance of speakers connected to other channels. When a main channel speaker has an ability to reproduce sound above 80 Hz, for example, a low-pitch register below 80 Hz is allocated to a sub-woofer. When a main channel speaker has an ability to reproduce sound above 200 Hz, a low-pitch register below 200 Hz is allocated to a sub-woofer.

An audiovisual amplifier (i.e. an AV amplifier) with low functionality has a limited function allowing its user to set a single crossover frequency over all channels. That is, an AV amplifier should be set with a relatively high crossover frequency depending on an inexpensive speaker with a low ability of reproduction of low-pitch sound. This will be explained by taking an example in which a main speaker of a front channel is able to reproduce sound above 80 Hz while speakers of other channels (e.g. center and surround channels) are able to reproduce sound above 200 Hz. In this example, the front channel is set with a crossover frequency of 200 Hz so that a sub-woofer only may be dedicated to reproduction of sound in a low-pitch register of 80-200 Hz even through the main speaker is able to reproduce sound in the low-pitch register of 80-200 Hz.

The main speaker may demonstrate its primary performance to reproduce low-pitch sound if another speaker, such as a speaker of a center channel, has an ability to lower its reproducible frequency range.

Considering this situation, audio equipment manufacturers have been developing various types of technologies that cause a missing fundamental effect by generating harmonics, thus lowering reproducible frequencies in terms of an audio sensation by listeners.

Patent Document 1, namely Japanese Patent Application Publication No. 2010-237294, discloses an audio signal processing device that is able to reproduce sound with the enhancement of low-pitch sound by adding harmonics (belonging to the low-pitch register) to audio signals.

However, there is a problem that sound quality will be degraded since waveforms may be largely distorted by harmonics. Patent Document 1 may provide a solution to this problem, however, with a high load of processing.

Commercially available AV amplifiers with low functionality do not necessarily install high-performance digital signal processors (DSPs). These AV amplifiers are unable to achieve adequate processing on individual channels since they are unable to handle a high load of processing.

Moreover, it is difficult to adequately improve low-pitch volumes by simply adding harmonics to audio signals.

SUMMARY OF THE INVENTION

It is an object of the present invention to provide an audio signal processing device that is able to enhance a low-pitch register of an audio signal with a small load of processing not causing a significant distortion of a waveform.

A first aspect of the present invention refers to an audio signal processing device including a filtering part that extracts a low-pitch signal from an audio signal input thereto; a dynamic range compression part that compresses a dynamic range of the low-pitch signal by use of a time-variant gain relative to a peak value of the low-pitch signal, which is detected via a peak hold operation using a predetermined time constant, thus producing a compressed signal; and an adder that adds the compressed signal to the audio signal so as to produce a processed audio signal including harmonics causing a missing fundamental effect.

In the above, the dynamic range compression part includes an absolute value calculation part that calculates an absolute value of the low-pitch signal; a peak hold part that detects a peak of the absolute value of the low-pitch signal by use of the predetermined time constant; a gain determination part that determines the time-variant gain based on the detected peak of the absolute value of the low-pitch signal; and a level adjustment part that amplifies the low-pitch signal by use of the time-variant gain, thus producing the processed audio signal with a compressed dynamic range.

The predetermined time constant of the peak hold part is below two-hundred times higher than a time constant corresponding to a high cutoff frequency of the filtering part.

The gain determination part includes a dynamic range compression table describing gains relative to input values, so that an appropriate gain is read from the dynamic range compression table in response to the detected peak of the absolute value of the low-pitch signal.

A second aspect of the present invention refers to an audio amplifier including: a low-pass filter that extracts a low-pitch signal from an audio signal input thereto; a low-pitch enhancement part that enhances a low-pitch register of the audio signal; and a high-pass filter that extract a high-pitch signal from the audio signal whose low-pitch register is enhanced by the low-pitch enhancement part. Herein, the high-pitch signal is reproduced using a speaker whilst the low-pitch signal is reproduced using a sub-woofer speaker. The low-pitch enhancement part is configured of the audio signal processing device.

The present invention is able to cause harmonics by way of dynamic range compression requiring a light load of processing. Compared with the conventional technology using limiter processing, the present invention can significantly reduce a distortion of an audio waveform even though the low-pitch register is enhanced using harmonics.

The present invention offers light-load audio signal processing, which can be easily applied to an audio amplifier that processes multichannel audio signals without causing a high burden of processing. Herein, each channel can be independently processed with the enhancement of the low-pitch register by way of light-load audio signal processing.

Since harmonics are generated based on a low-pitch signal and added to an audio signal together with the low-pitch signal, it is possible to improve the sensation of the low-pitch register of the audio signal without damaging the original audio waveform.

BRIEF DESCRIPTION OF THE DRAWINGS

These and other objects, aspects, and embodiments of the present invention will be described in more detail with reference to the following drawings.

DESCRIPTION OF THE PREFERRED EMBODIMENT

The present invention will be described in further detail by way of examples with reference to the accompanying drawings.

Figure 1:
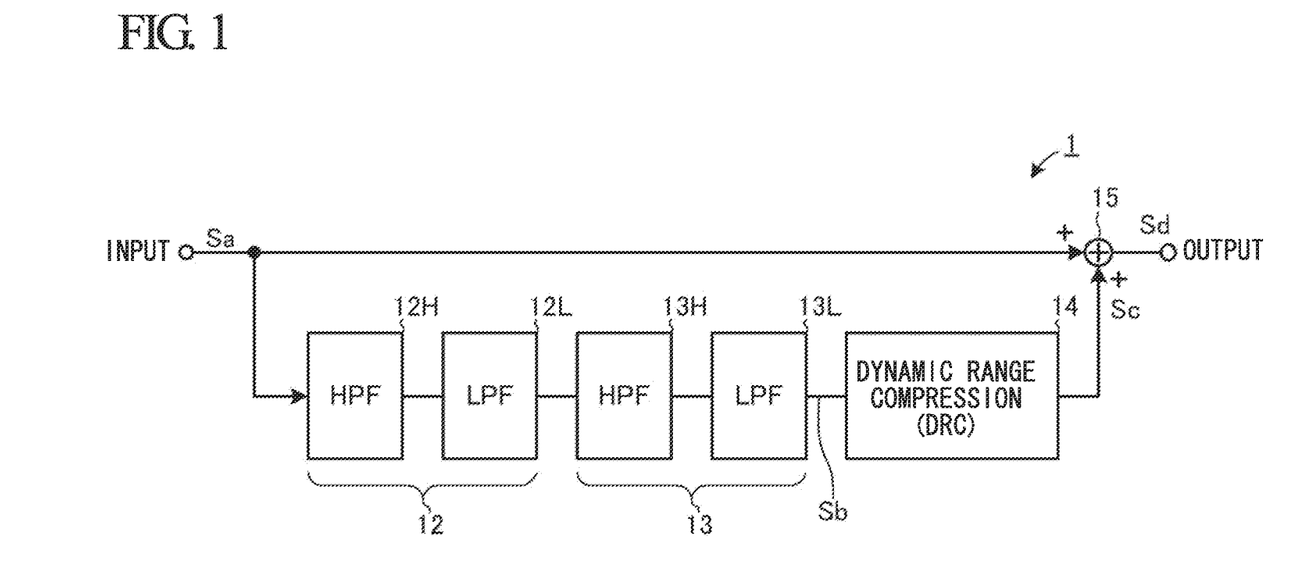
FIG. 1 is a block diagram of an audio signal processing device according to an embodiment of the present invention.

FIG. 1 is a block diagram of an audio signal processing device 1 according to a preferred embodiment of the present invention. The audio signal processing device 1 extracts a low-pitch signal Sb from an audio signal Sa representing an original sound input thereto. The dynamic range compression is applied to the low-pitch signal Sb so as to produce a compressed signal Sc, which is then added to the audio signal Sa. This simple processing boosts a volume in a low-pitch register of the audio signal Sa while generating odd harmonics in the low-pitch register, thus causing a missing fundamental effect for a listener and thereby enhancing the low-pitch register of sound in terms of a listener's audio sensation. In this processing, a low-pitch component of an original sound is subjected to dynamic range compression and then added to the original sound. Compared with the conventional technology for directly processing original sound or for applying a limiter (i.e. amplitude limitation) to original sound, this processing does not cause a significant degradation of original sound. The dynamic range compression is used to control a gain for amplifying an audio signal with a small or soft variation of an amplitude envelope of an audio signal.

Referring back to FIG. 1, the audio signal processing device 1 includes a band-pass filters 12, 13, a dynamic range compression part 14, and an adder 15. The audio signal Sa representing an original sound is input to an input terminal, processed, and then output from an output terminal as a processed audio signal Sd with the enhancement of its low-pitch register. The input terminal is directly connected to the adder 15, while the input terminal is indirectly connected to the adder 15 via a bypass, i.e. a harmonic generating part including the band-pass filters 12, 13 (which are coupled together in series) and the dynamic range compression part 14.

The band-pass filter 12 includes a high-pass filter (HPF) 12H and a low-pass filter (LPF) 12L which are coupled in series. The HPF 12H is configured of a second-order BR (Infinite Impulse Response) filter with Butterworth characteristics as well as with a cutoff frequency of 20 Hz and an attenuation characteristic of 12 dB/oct. Of course, the HPF 12H is not necessarily limited in this configuration, cutoff frequency, and attenuation characteristic. The LPF 12L is configured of a second-order BR filter with Butterworth characteristics as well as with a cutoff frequency of 100 Hz and an attenuation characteristic of 12 dB/oct. Of course, the LPF 12L is not necessarily limited in this configuration, cutoff frequency, and attenuation characteristic. In this connection, the band-pass filter 12 is not necessarily limited to a combination of a high-pass filter and a low-pass filter; hence, the band-pass filter 12 can be configured of a single filter with a specific band-pass filtering characteristic.

Similar to the band-pass filter 12, the band-pass filter 13 is configured of a high-pass filter (HPF) 13H and a low-pass filter (LPF) 13L which are connected in series. Herein, the HPF 13H has a cutoff frequency of 60 Hz while the LPF 13L has a cutoff frequency of 200 Hz. It is possible to extract the low-pitch signal Sb from the audio signal Sa by way of the band-pass filters 12 and 13. The reason why two band-pass filters 12, 13 are connected in series is to provide a diversity in freely designing a sharp cutoff frequency. For this reason, it is possible to provide a single band-pass filter instead of the band-pass filters 12, 13. Such a single band-pass filter is not necessarily configured of a high-pass filter and a low-pass filter; hence, it can be designed as a single entity with a specific band-pass filtering characteristic.

The low-pitch signal Sb is supplied to the dynamic range compression part 14. The dynamic range compression part 14 carries out dynamic range compression with a short time constant on the low-pitch signal Sb, thus producing a compressed signal Sc. Namely, the compressed signal Sc indicates the dynamic-range compressed low-pitch signal Sb, which includes harmonics and which is boosted in a low-pitch volume. The compressed signal Sc is supplied to the adder 15.

The adder 15 adds the compressed signal Sc to the audio signal Sa so as to produce the processed audio signal Sd, which is output from the output terminal.

Figure 2:
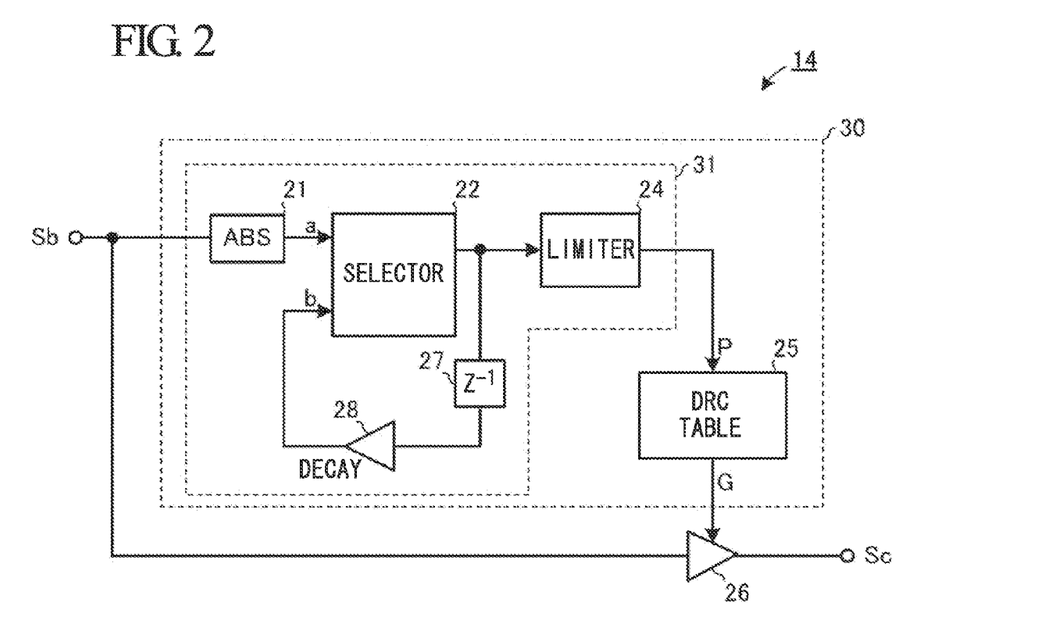
FIG. 2 is a block diagram of a dynamic range compression part included in the audio signal processing device.

FIG. 2 is a block diagram of the dynamic range compression part 14. The dynamic range compression part 14 includes an absolute value calculation part (ABS) 21, a selector 22, a limiter 24, a DRC (Dynamic Range Compression) table 25, a level adjustment part 26, a delay element 27, and a decay element (or an attenuating multiplier) 28.

Figure 3:
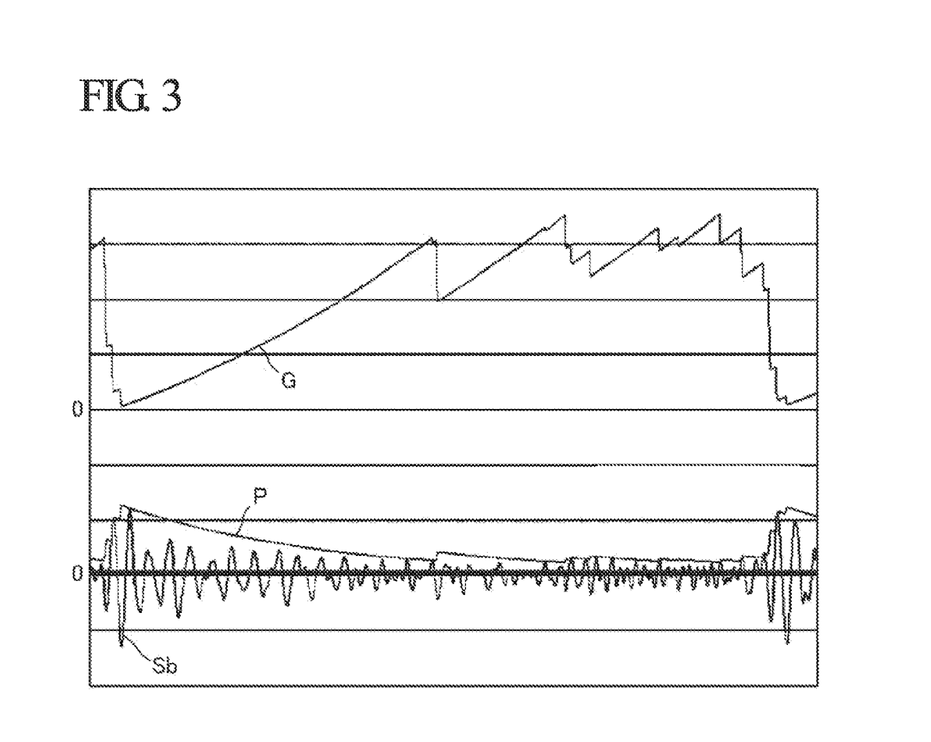
FIG. 3 is a graph showing waveforms at various points in the dynamic range compression part.

FIG. 3 is a graph showing various waveforms at various points in the dynamic range compression part 14. Specifically, FIG. 3 shows the waveform of the low-pitch signal Sb (i.e. an input signal of the dynamic range compression part 14), a peak detection curve P (which is detected by the selector 22), and a gain G (which is calculated based on the peak detection curve P).

In FIG. 2, the dynamic range compression part 14 inputs the low-pitch signal Sb and sends it to the level adjustment part 26 and a gain determination part 30. The level adjustment part 26 adjusts the level of the low-pitch signal Sb so as to produce the compressed signal Sc. The level adjustment is performed based on the gain G which is determined by the gain determination part 30. The gain determination part 30 determines the gain G with respect to time in such a way that the dynamic range of the low-pitch signal Sb will be compressed based on the amplitude of the low-pitch signal Sb, in other words, in such a way that the amplitude envelope of the low-pitch signal Sb will undergo small variation and/or soft variation.

The gain determination part 30 includes the DRC table 25 and a peak detection part 31. The peak detection part 31 includes the absolute value calculation part (ABS) 21, the selector 22, the limiter 24, the delay element 27, and the decay element 28. The peak detection part 31 is a peak hold circuit whose time constant is determined by the decay element 28.

The absolute value calculation part 21 calculates an absolute value in the amplitude of the low-pitch signal Sb by way of full-wave rectification. That is, the absolute value calculation part 21 inverts a negative-side half wave in the waveform of the low-pitch signal Sb (see FIG. 3) into a positive side.

The selector 22 compares input values a, b so as to selectively output the larger one. The input value "a" indicates the absolute value of the low-pitch signal Sb from the absolute value calculation part 21. The input value "b" indicates a one-sample preceding value which is selected by the selector 22 one sample before and attenuated (or decayed) by the decay element 28. That is, the input value "b" corresponds to the previously selected value of the selector 22 which is delayed by one sample via the delay element 27 and attenuated by the decay element 28. The decay element 28 is set with a time constant (or an attenuation characteristic) of −9 dB/150 ms or so. For instance, the time constant TC of the decay element 28 becomes equal to 150 ms if the time constant is defined as the time in which the amplitude is reduced to 1/e (where "e" denotes Napier's number), e.g. −9 dB.

Generally speaking, a time constant T of a low-pass filter is given by the following equation.

$$T = 1/(2 \times \pi \times fc)$$

where π denotes a circle ratio, and fc denotes a cutoff frequency.

Since the cutoff frequency of the LPF 12L is fc12=100 Hz, the time constant of the LPF 12L is T12=1.59 ms. The LPF 12L defines the upper-limit frequency for the low-pitch signal Sb. The time constant TC of the decay element 28 is approximately one-hundred times higher than the time constant T12 of the LPF 12L, wherein a ratio of time constants is optimized to cause a missing fundamental effect on an audio sensation without causing an excess distortion of a waveform. Even though the time constant TC of the decay element 28 is longer than the time constant T12 of the LPF 12L, the time constant TC is sufficiently shorter than the time constant of a compressor serving as an effecter, thus achieving high-speed processing. The time constant TC of the decay element 28 may be determined based on an audio sensation and a degree of occurrence of harmonic spectrums. The inventors have conducted experiments to determine that the ratio of the time constant TC of the decay element 28 to the time constant T12 of the LPF 12L may preferably range from 50-fold to 200-fold.

Figure 4:
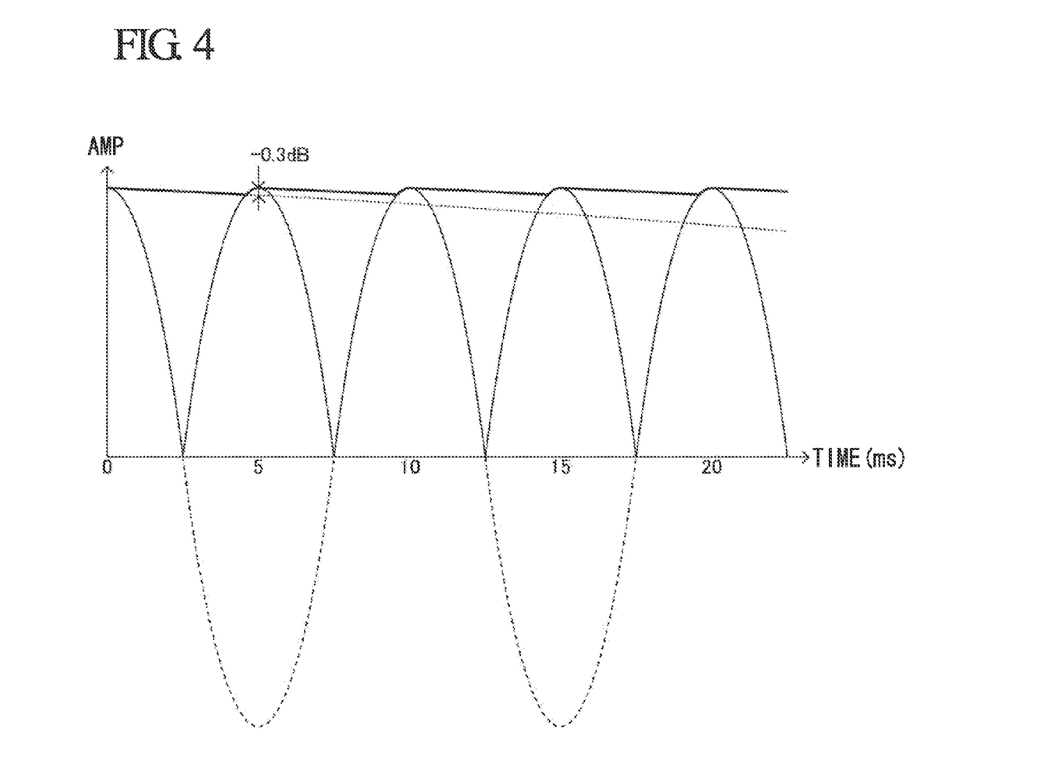
FIG. 4 shows a decay curve superimposed on a sinusoidal curve of 100 Hz subjected to full-wave rectification.

FIG. 4 shows a decay curve of −9 dB/150 ms superimposed on a sine curve of 100 Hz which is full-wave rectified. The decay curve descends at a rate of −9 dB/150 ms from a peak of a sinusoidal waveform so that its level decreases by approximately −3 dB at the next peak of the sinusoidal waveform. The peak detection curve P (output from the peak detection part 31) descends at a rate of −9 dB/150 ms, along the decay curve, from a peak of a waveform so that its level is updated with the level of the next peak of the waveform when the peak detection curve P comes across the waveform. This value of the time constant (or decay characteristic) brings an optimum distortion causing harmonics, thus causing a missing fundamental effect on the waveform of an audio signal. That is, a time constant slower than this value may not cause an adequate distortion (or adequate harmonics) while a time constant faster than this value may cause an excess distortion which degrades a tone color of an audio signal. In short, this value of the time constant is preferable for use in audio signal processing on an audio sensation.

By setting this value of the time constant, the selector 22 provides an output waveform, i.e. the peak detection curve P (see FIG. 3) which instantly responds to a high peak of the low-pitch signal Sb (i.e. the absolute value of the low-pitch signal Sb) and then gradually decays at the rate of −9 dB/150 ms substantially along an envelope curve.

The limiter 24 is an operation part that defines a lower-limit value in dynamic range compression using the peak detection curve P. Even when the output waveform of the selector 22 decreases to be lower than −30 dB, the limiter 24 sustains −30 dB in the peak detection curve P. That is, the same gain at −30 dB is sustained even when the input level becomes lower than −30 dB. In this connection, the limit value of the limiter 24 is not necessarily limited to −30 dB. Additionally, it is possible to incorporate another limiter that limits the upper-limit value of the peak detection curve P.

The peak detection curve P whose lower-limit value is limited by the limiter 24 provides a reference value to the DRC table 25. The DRC table 25 provides the gain G in correspondence with the reference value, i.e. the peak detection curve P input thereto. The gain G serving as a multiplication coefficient is applied to the multiplier 26. The present embodiment provides the gain G relative to the peak detection curve P shown in FIG. 3.

Figure 5A:
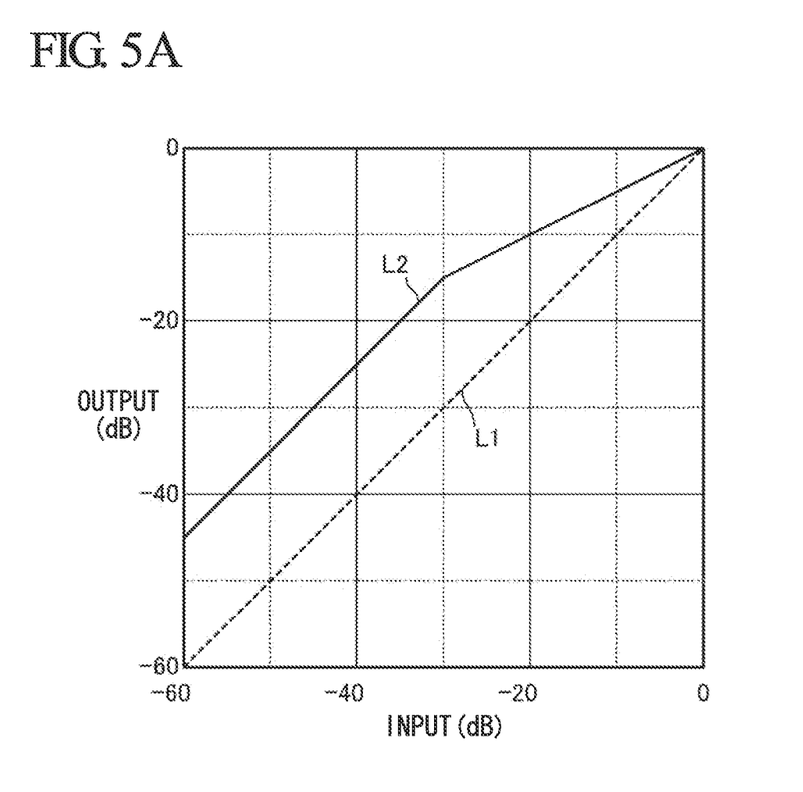
FIG. 5 illustrates the content of a DRC table included in the dynamic range compression part shown in FIG. 2 with a graph of input/output relationship (A) and a table (B).
Figure 5B:
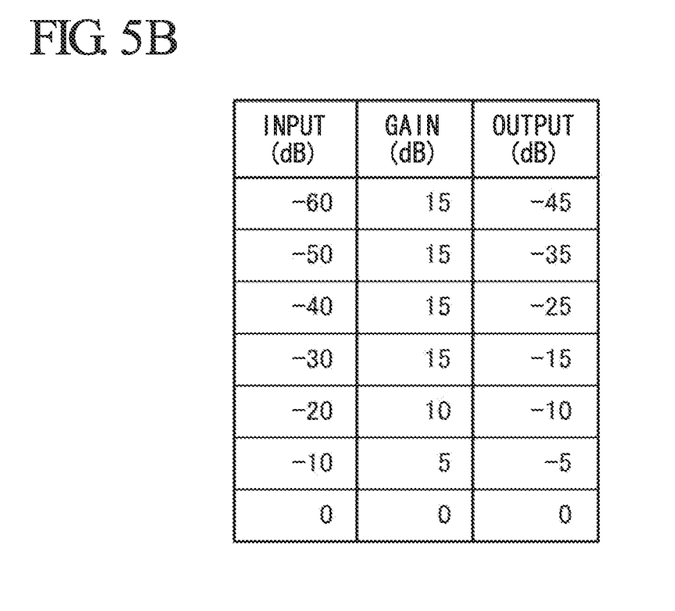

FIG. 5 illustrates the content of the DRC table 25. FIG. 5(A) is a graph showing the input/output relationship in which an input range of −30 to 0 dB (i.e. a dynamic range of 30 dB) is compressed into half to provide an output range of −15 to 0 dB. In FIG. 5(A), the horizontal axis represents an input value while the vertical axis represents an output value. A line L1 indicates the input/output relationship not involving dynamic range compression (DRC), i.e. a linear output curve. An angular line L2 indicates the input/output relationship involving DRC. FIG. 5(B) is a table showing the relationship between an input value, a gain, and an output value in decibel at intervals of 10 dB. As shown in FIG. 5, an input value below −30 dB does not involve compression so that the gain is fixed to a constant value, i.e. 15 dB. When an input value increases to be higher than −30 dB, the gain gradually decreases so that the gain equals 10 dB relative to an input value of −20 dB, the gain equals 5 dB relative to an input value of −10 dB, and the gain equals 0 dB relative to an input value of 0 dB.

Referring back to FIG. 2, the level adjustment part 26 adjusts the level of the low-pitch signal Sb by use of the gain G, thus providing the compressed signal Sc. The adder 15 (see FIG. 1) adds the compressed signal Sc to the audio signal Sa so as to produce the processed audio signal Sd.

Figure 6A:
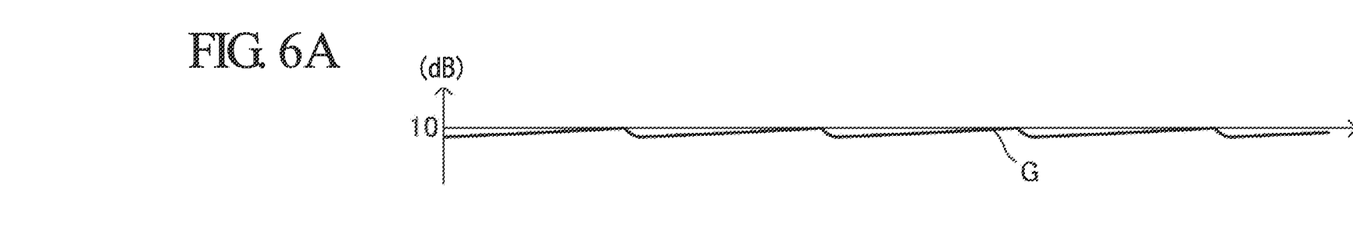
FIG. 6 is a graph showing waveforms denoted by G, Sb, Sc at various portions in the dynamic range compression part inputting a sinusoidal waveform of 100 Hz.
Figure 6B:
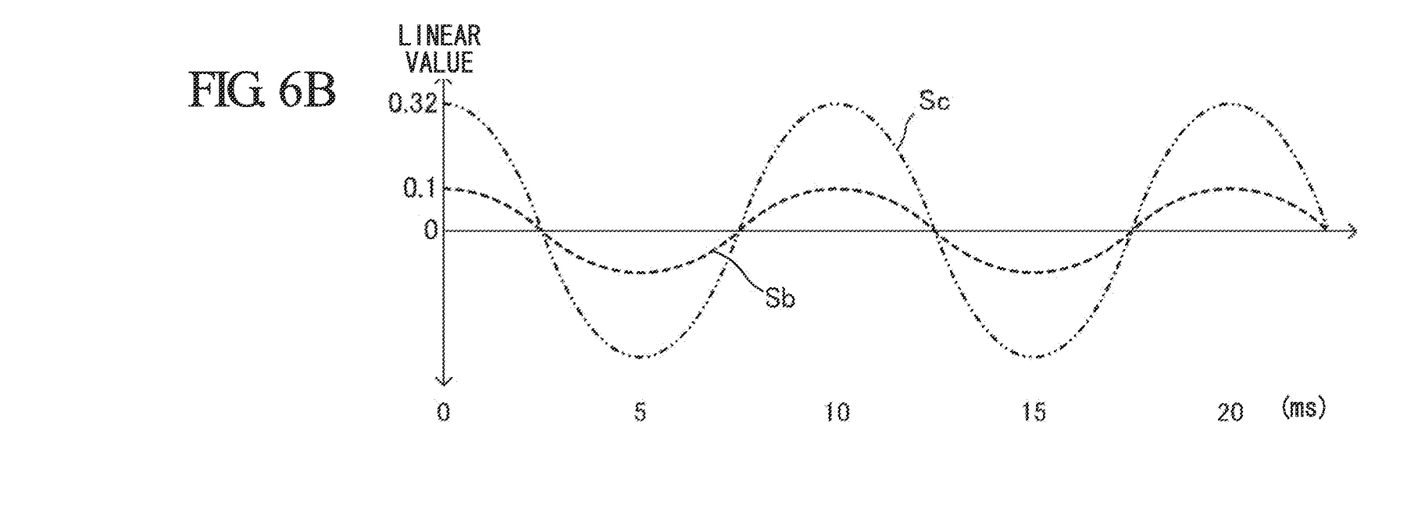
Figure 7:
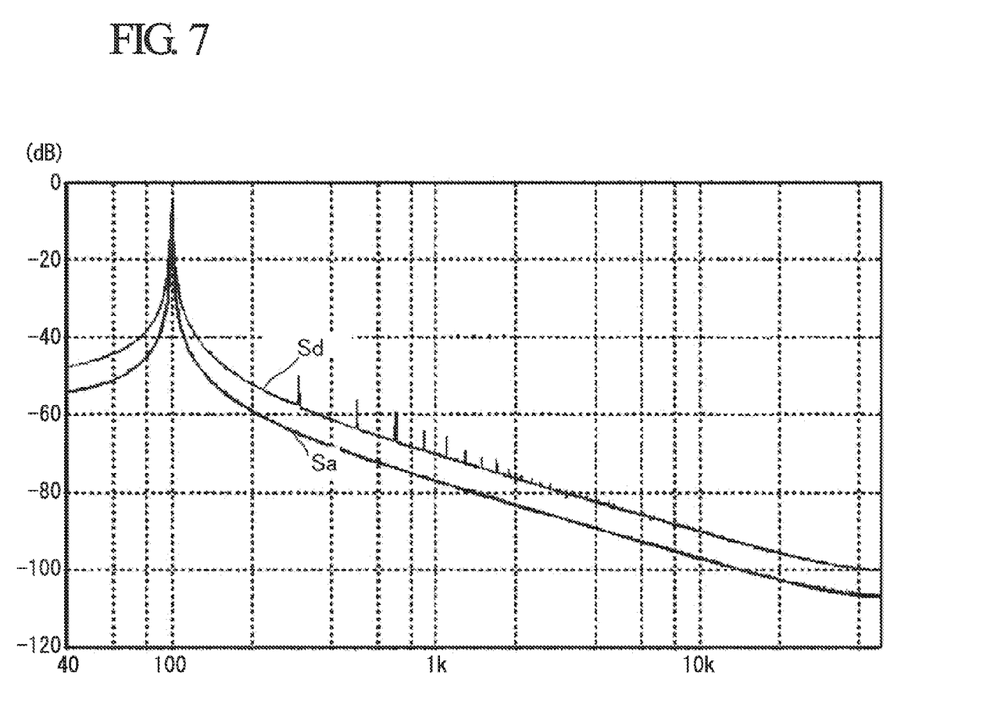
FIG. 7 is a graph showing a frequency spectrum of a processed audio signal Sd based on an original audio signal Sa corresponding to a sinusoidal waveform of 100 Hz.

FIG. 6 illustrates the operation of the audio signal processing device 1 inputting a sinusoidal waveform of 100 Hz (see FIG. 4) with −20 dB, wherein FIG. 6 shows the waveform of the input signal Sb (corresponding to the sinusoidal waveform), the waveform of the output signal Sc (corresponding to the peak detection curve P), and the gain G. FIG. 7 is a graph showing a frequency spectrum of the processed audio signal Sd which is produced from the audio signal processing device 1 inputting a sinusoidal waveform of 100 Hz (see FIG. 4) with −20 dB. FIG. 6 shows that an input signal of −20 dB (indicating a linearity value of 0.1) is amplified using the gain G whose value approximately equals to +10 dB (indicating a linearity value of 3.2), thus producing the compressed signal Sc of approximately −10 dB (indicating a linearity value of 0.32). At this time, the gain G is read approximately +10 dB from the upper portion of FIG. 6, wherein subtle waviness with a period of 200 Hz occurs owing to the foregoing operation of FIG. 4 in which a decay waveform is updated with a peak value of an input waveform. This subtle waviness leads to a subtle distortion of a waveform (which may not unfavorably affect an audio sensation), thus causing harmonics.

As shown in FIG. 7, the processed audio signal Sd is entirely improved in acoustic loudness and enhanced particularly in the low-pitch register in comparison with the original audio signal Sa, wherein the processed audio signal Sd includes odd harmonics (e.g. 300 Hz, 500 Hz, . . . ) based on the fundamental tone frequency of 100 Hz. Additionally, no unwanted frequency components causing noise may peak in the waveform of the processed audio signal Sd.

Since the time constant is applied to the detected peak of the absolute value of an input audio signal, it is possible to generate a gain curve (indicating the gain G) having a low-frequency variation. The gain G serving as a multiplication coefficient is applied to the low-pitch signal Sb so as to produce the compressed signal Sc including harmonics, which are preferable to cause a missing fundamental effect, thus boosting the low-pitch register in its acoustic loudness. Additionally, the present embodiment adopts a high-speed time constant (or a release time), causing a gradual but adequate variation of the gain G; hence, it is possible to cause harmonics while suppressing an excessive distortion of an audio waveform.

The processed audio signal Sd, including odd harmonics in the low-pitch register, makes it possible to cause a missing fundamental effect for a listener, thus enhancing an audio sensation in the low-pitch register. Additionally, the present embodiment carries out dynamic range compression on a low-pitch signal extracted from an original audio signal and then adds a compressed signal to the original audio signal; this may not significantly degrade sound quality.

Although the dynamic range compression part 14 of FIG. 2 employs a peak detection procedure (or a decay procedure) for detecting the level of the low-pitch signal Sb, it is possible to employ a level detection procedure for detecting the level of the low-pitch signal Sb by calculating its effective value in a short time.

Alternatively, it is possible to employ both the peak detection procedure and the level detection procedure. It is noted that the peak detection procedure is simple rather than the level detection procedure; hence, the peak detection procedure may not need a high load of processing, thus sustaining an adequate ability of processing.

The foregoing description refers to signal levels in decibels (dB); however, actual processing can be performed using linear amplitude values (e.g. decimal values ranging from 0 to 32,768 in the case of 16-bit data). Additionally, the present embodiment utilizes the DRC table 25 for determination of the gain G; but it is possible to determine the gain G by way of calculation. In this connection, calculation can be performed using either a decibel (dB) value or a linear value.

Figure 9A:
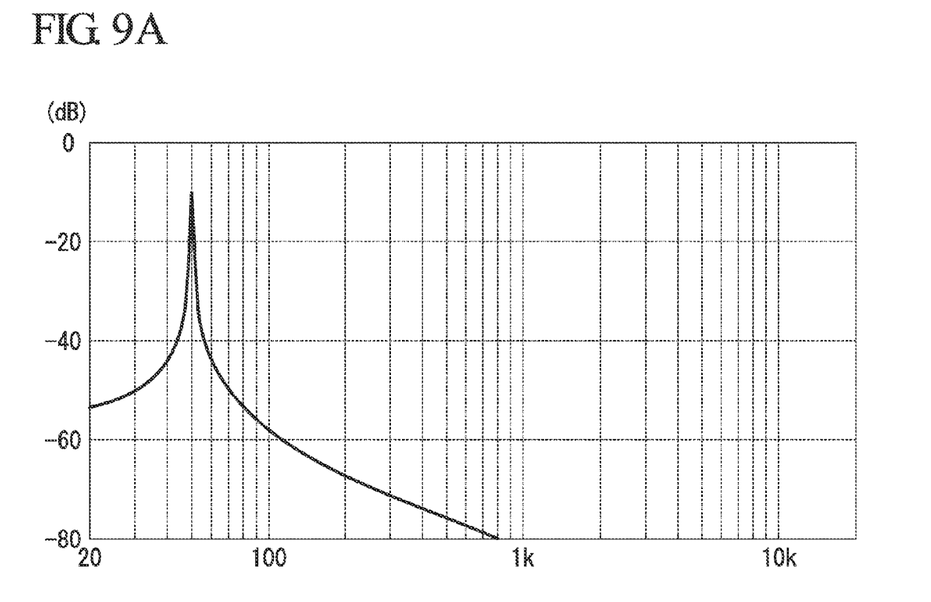
FIG. 9A is a graph showing the original waveform of an audio signal representing a sinusoidal waveform at 50 Hz.
Figure 9B:
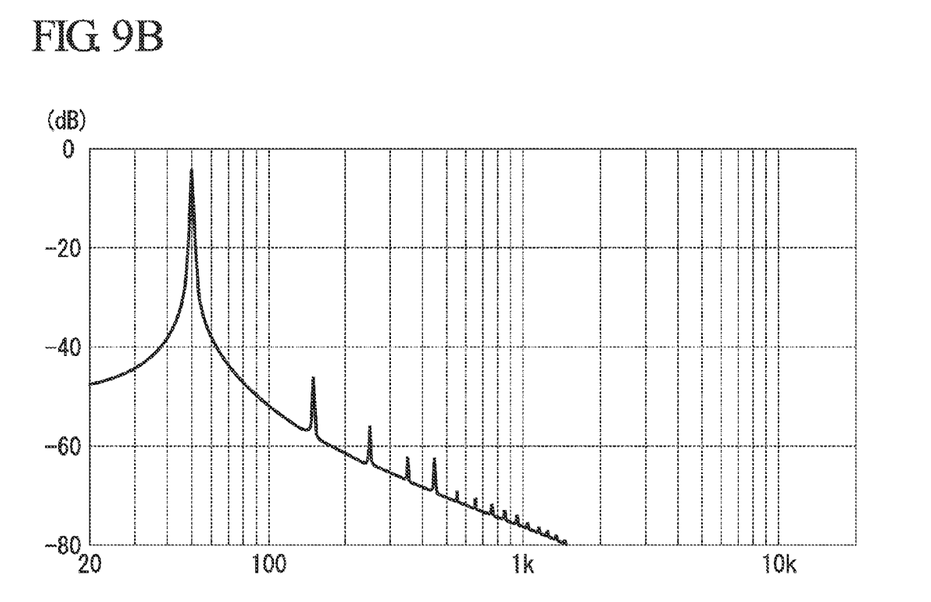
FIG. 9B is a graph showing a significantly distorted waveform due to high-level harmonics when a short time constant is set to a peak hold circuit.
Figure 9C:
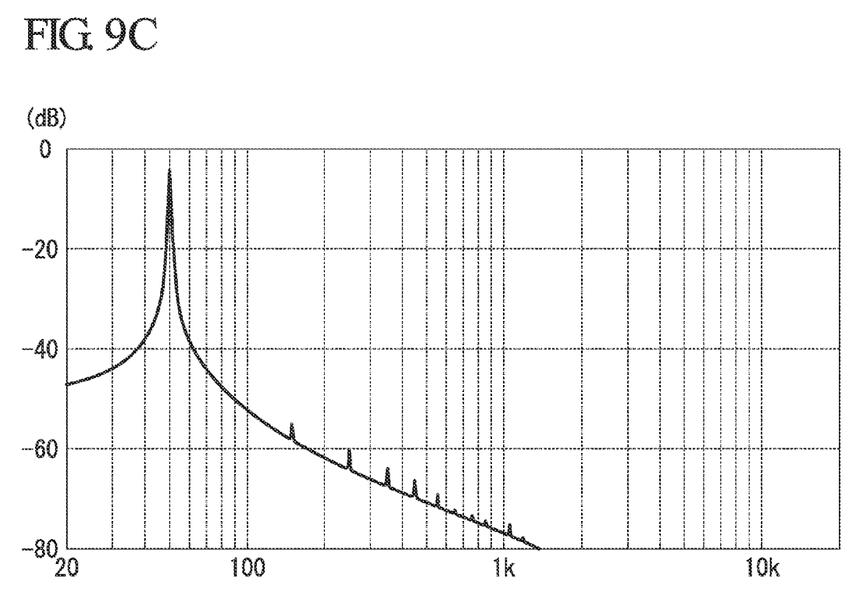
FIG. 9C is a graph showing a moderately distorted waveform with appropriately sound boost which occurs when an appropriate time constant is set to the peak hold circuit.
Figure 9D:
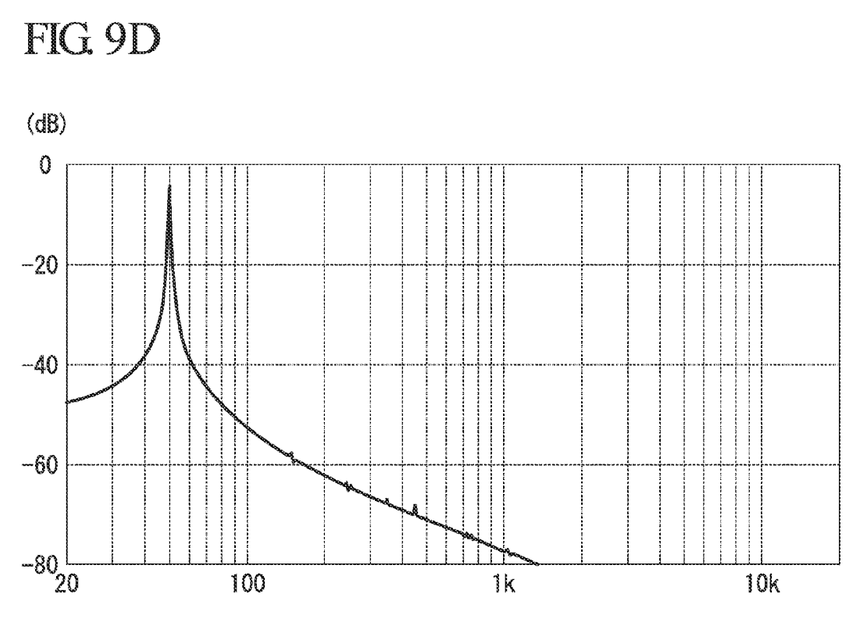
FIG. 9D is a graph showing a slightly distorted waveform which may not cause a missing fundamental effect when a long time constant is set to the peak hold circuit.

The technical feature of the present embodiment will be described in further detail with reference to FIGS. 9A to 9D, illustrating how the setting of a time constant affects the waveform of an audio signal. FIG. 9A shows the original waveform of an audio signal, i.e. a sinusoidal waveform at 50 Hz. FIG. 9B shows a significantly distorted waveform due to high-level harmonics which occur when a short time constant is set to a peak hold circuit. FIG. 9C shows a moderately distorted waveform whose sound pressure is moderately boosted when an appropriate time constant is set to the peak hold circuit. FIG. 9D shows a slightly distorted waveform which may not cause a missing fundamental effect when a long time constant is applied to the peak hold circuit. That is, the present embodiment provides a moderate distortion to the original waveform of an audio signal whose low-pitch sound is appropriately boosted, thus causing a missing fundamental effect as shown in FIG. 9C. For this reason, the time constant of the decay element 28 is set to a range of 50-200 multiplication factors higher than the time constant of a high cut-off frequency.

Figure 8:
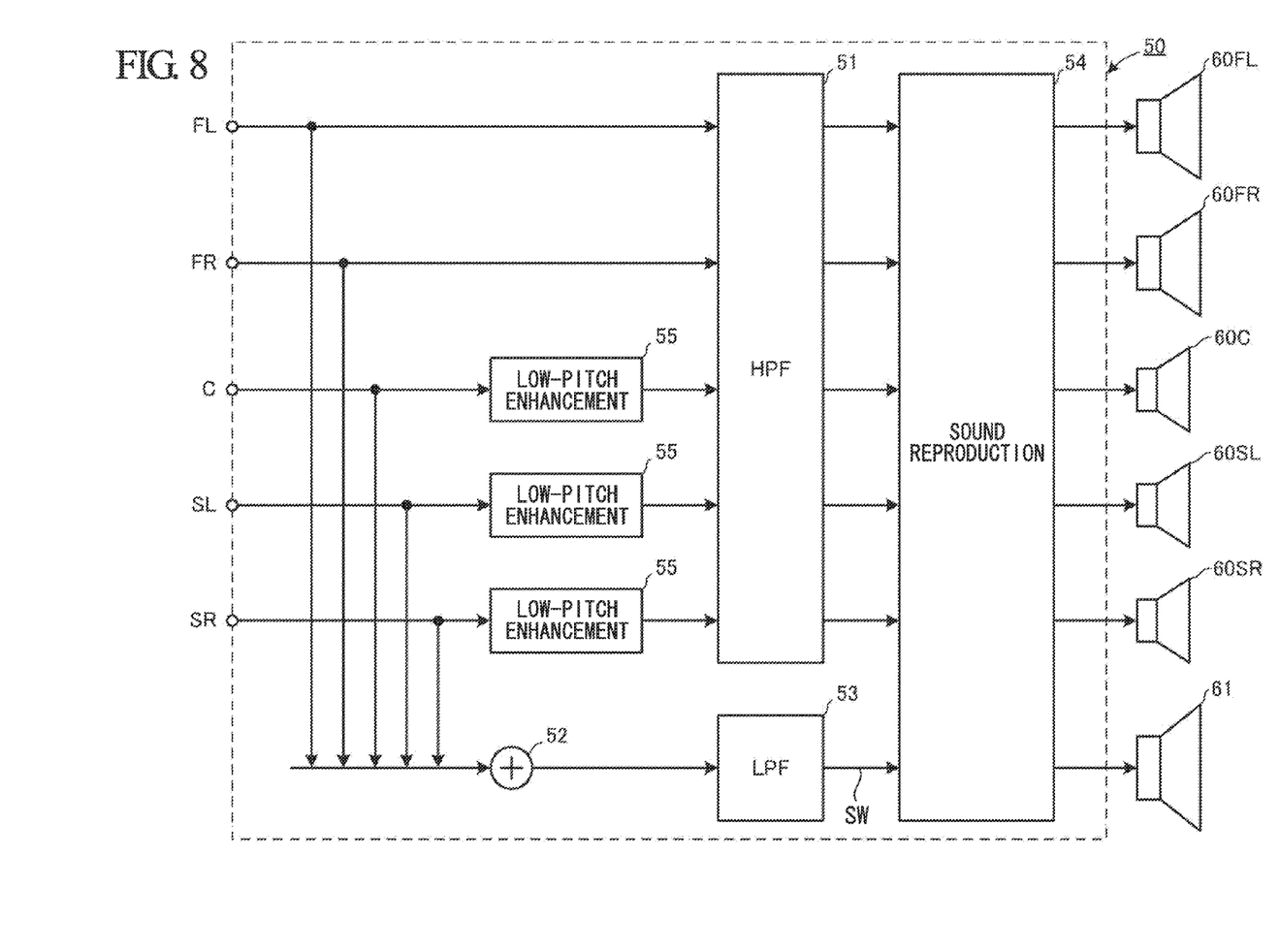
FIG. 8 is a block diagram of an audio amplifier adopting the audio signal processing device as a low-pitch enhancement part with respect to a specific channel.

FIG. 8 is a block diagram of an audio amplifier 50 adopting the configuration of the audio signal processing device 1. The audio amplifier 50 is a 5.1 multichannel audio amplifier with five channels, namely a front-left channel FL, a front-right channel FR, a center channel C, a surround-left channel SL, and a surround-right channel SR. Low-pitch signals are extracted from audio signals of five channels and mixed together so as to produce a low-pitch signal for a sub-woofer channel SW.

Speakers 60FL, 60FR, 60C, 60SL, and 60SR (collectively referred to as speakers 60) are connected to the front-left channel FL, front-right channel FR, center channel C, surround-left channel SL, and surround-right channel SR respectively, while a speaker 61 is connected to the sub-woofer channel SW. Herein, the speakers 60 of five channels are not necessarily identified with each other in their audio characteristics. Specifically, large-size speakers with good audio characteristics (e.g. reproducible frequency ranges above 80 Hz) are employed as the speakers 60FL and 60FR corresponding to the front-left channel FL and the front-right channel FR. Small-size speakers with limited audio characteristics (e.g. reproducible frequency ranges above 200 Hz) are employed as the speakers 60C, 60SL, and 60SR corresponding to the center channel C, the surround-left channel SL, and the surround-right channel SR.

Audio signals of five channels are supplied to a high-pass filter (HPF) 51 which cut outs low-pitch signals whose frequencies are lower than reproducible frequencies of the speakers 60. Audio signals of five channels passing through the HPF 51 are supplied to a sound reproduction part 54. Additionally, audio signals of five channels are directly added together via an adder 52 and then supplied to a low-pass filter (LPF) 53 which extracts a low-pitch signal whose frequency is lower than reproducible frequencies of the speakers 60. The low-pitch signal is supplied to the sound reproduction part 54 as an audio signal for use in the sub-woofer channel SW.

The sound reproduction part 54 performs predetermined processing, such as equalization, sound-field formation and amplification, on audio signals supplied thereto, thus providing processed audio signals to the speakers 60 and 61. The speakers 60 and 61 generate sounds based on processed audio signals.

An audio amplifier with low functionality may be able to set a single crossover frequency over all channels in connection with the cutoff frequencies of the HPF 51 and the LPF 53. The audio amplifier 50 is designed to employ small-size speakers with a lower-limit reproducible frequency of 200 Hz as the speakers 60C, 60SL, and 60SR corresponding to the center channel C, the surround-left channel SL, and the surround-right channel SR. To cover all frequencies by use of the sub-woofer channel SW, a cutoff frequency of 200 Hz should be applied to the HPF 51 and the LPF 53 so that so that low-frequency components below 200 Hz will be reproduced using the sub-woofer speaker 61.

Even though the speakers 60FL and 60FR corresponding to the front-left channel FL and the front-right channel FR are large-size speakers with a lower-limit reproducible frequency of 80 Hz, low-frequency components ranging from 80 Hz to 200 Hz are allocated to the speaker 61 of the sub-woofer channel SW so that they will not be output via the front channels enabling sound field formation.

The audio amplifier 50 is characterized in that low-pitch enhancement parts 55, each corresponding to the audio signal processing device 1, are inserted with respect to the center channel C, the surround-left channel SL, and the surround-right channel SR which are connected to the speakers 60C, 60SL, and 60SR which are configured of small-size speakers, wherein audio signals of these three channels are processed to allow a listener to audibly sense low-pitch components ranging from 80 Hz to 200 Hz owing to a missing fundamental effect. For this reason, the same cutoff frequency of 80 Hz can be set for both HPF 51 and LPF 53.

Although the speakers 60C, 60SL, and 60SR corresponding to the center channel C, the surround-left channel SL, and the surround-right channel SR cannot reproduce low-pitch components ranging from 80 Hz to 200 Hz, the audio amplifier 50 causes a missing fundamental effect so as to allow a listener to sense low-pitch components. In contrast, the speakers 60FL and 60FR corresponding to the front-left channel FL and the front-right channel FR are configured of large-size speakers with good audio characteristics, which are able to reproduce low-pitch components; hence, it is possible to perform sound localization and sound field formation in a desirable manner.

The audio amplifier 50 of FIG. 8 is designed to insert the low-pitch enhancement parts 55 with respect to the center channel C, the surround-left channel SL, and the surround-right channel SR; but this is not a restriction. Additionally, a decision as to whether to insert the low-pitch enhancement part 55 is made based on the reproducible frequency of each speaker; but this is not a restriction. For instance, it is possible to insert the low-pitch enhancement parts 55 with respect to all channels, irrespective of performances of their speakers.

Lastly, the present invention is not necessarily limited to the foregoing embodiment, which can be modified in various ways within the scope of the invention as defined by the appended claims.

What is claimed is:

1. An audio signal processing device comprising:
a filtering part that extracts a low-pitch signal from an audio signal input thereto;
a dynamic range compression part that compresses a dynamic range of the low-pitch signal by use of a time-variant gain relative to a peak of the low-pitch signal, which is detected via a peak hold operation using a predetermined time constant, thus producing a compressed signal; and
an adder that adds the compressed signal to the audio signal so as to produce a processed audio signal including harmonics causing a missing fundamental effect,
wherein the dynamic range compression part includes an absolute value calculation part that calculates an absolute value of the low-pitch signal;
a peak hold part that detects a peak of the absolute value of the low-pitch signal by use of the predetermined time constant;
a gain determination part that determines the time-variant gain based on the detected peak of the absolute value of the low-pitch signal; and
a level adjustment part that amplifies the low-pitch signal by use of the time-variant gain, thus producing the processed audio signal with a compressed dynamic range, and
wherein the predetermined time constant of the peak hold part is in a range of fifty times higher to two-hundred times higher than a time constant corresponding to a high cutoff frequency of the filtering part.

2. The audio signal processing device according to claim 1, wherein the gain determination part includes a dynamic range compression table describing gains relative to input values, so that an appropriate gain is read from the dynamic range compression table in response to the detected peak of the absolute value of the low-pitch signal.

3. An audio amplifier comprising:
a low-pass filter that extracts a low-pitch signal from an audio signal input thereto;
a low-pitch enhancement part that enhances a low-pitch register of the audio signal; and
a high-pass filter that extract a high-pitch signal from the audio signal whose low-pitch register is enhanced by the low-pitch enhancement part,
wherein the high-pitch signal is reproduced using a speaker whilst the low-pitch signal is reproduced using a sub-woofer speaker,
wherein the low-pitch enhancement part is configured of an audio signal processing device including:
a filtering part that extracts a secondary low-pitch signal from the audio signal;
a dynamic range compression part that compresses a dynamic range of the secondary low-pitch signal by use of a time-variant gain relative to a peak of the secondary low-pitch signal, which is detected via a peak hold operation using a predetermined time constant, thus producing a compressed signal; and
an adder that adds the compressed signal to the audio signal so as to produce a processed audio signal including harmonics causing a missing fundamental effect,
wherein the dynamic range compression part includes an absolute value calculation part that calculates an absolute value of the secondary low-pitch signal;
a peak hold part that detects a peak of the absolute value of the secondary low-pitch signal by use of the predetermined time constant;
a gain determination part that determines the time-variant gain based on the detected peak of the absolute value of the secondary low-pitch signal; and
a level adjustment part that amplifies the secondary low-pitch signal by use of the time-variant gain, thus producing the processed audio signal with a compressed dynamic range, and
wherein the predetermined time constant of the peak hold part is in a range of fifty times higher to two-hundred times higher than a time constant corresponding to a high cutoff frequency of the filtering part.

* * * * *